United States Patent [19]

Watanabe

[11] 3,806,773

[45] Apr. 23, 1974

[54] FIELD EFFECT TRANSISTOR HAVING BACK-TO-BACK DIODES CONNECTED TO THE GATE ELECTRODE AND HAVING A PROTECTIVE LAYER BETWEEN THE SOURCE AND THE DIODES TO PREVENT THYRISTOR ACTION

[75] Inventor: Seiichi Watanabe, Tokyo, Japan

[73] Assignee: Sony Corporation, Tokyo, Japan

[22] Filed: July 7, 1972

[21] Appl. No.: 269,765

[30] Foreign Application Priority Data

July 17, 1971 Japan .......................... 46-63281[U]

[52] U.S. Cl. ...... 317/235 R, 317/235 B, 317/235 D, 317/235 E, 317/235 G

[51] Int. Cl. .......................... H01l 11/00, H01l 15/00

[58] Field of Search ........... 317/235, 21.1, 22, 22.2, 317/22.1

[56] References Cited

UNITED STATES PATENTS 3,648,129 3/1972 Nienhuis .......................... 317/235 R 3,469,155 9/1969 Van Beek .......................... 317/235 G 3,470,390 9/1969 Lin .......................... 317/235 G 3,512,058 5/1970 Khajezadeth .......................... 317/235 G

OTHER PUBLICATIONS

RCA Technical notes; by Dennehy, TN No. 876 Feb. 12, 1971, pages 1 to 4.

*Primary Examiner*—Andrew J. James

*Attorney, Agent, or Firm*—Hill, Sherman, Meroni, Gross & Simpson

[57] ABSTRACT

An insulated gate field effect transistor having protective means for the gate insulator layer. The protection means comprises two back-to-back diodes connected to the gate electrode. The source region of the FET is partially encompassed by a relatively high impurity concentration region of opposite conductivity type to that of the source region. The encompassing region of relatively high impurity concentration is of the same impurity as that of the substrate and is so located that there is no thyristor action between the source and the diodes.

6 Claims, 5 Drawing Figures

FIELD EFFECT TRANSISTOR HAVING BACK-TO-BACK DIODES CONNECTED TO THE GATE ELECTRODE AND HAVING A PROTECTIVE LAYER BETWEEN THE SOURCE AND THE DIODES TO PREVENT THYRISTOR ACTION

BACKGROUND OF THE INVENTION

1. Field of the Invention

This invention relates in general to an MIS (metal-insulator-semiconductor) type field effect transistor and in particular to one having protective means for the insulating layer against destructive breakdown.

2. Description of the Prior Art

MIS transistors have been provided in the past with punch-through diodes (lateral-type) such, for example, as described in U.S. Pat. Nos. 3,469,155 and 3,470,390. One form of prior art MIS field effect transistor has a pair of pn junction diodes to protect its gate insulating layer from destructive breakdown by having the diodes such that they will break down on the application of a voltage somewhat below the voltage of the destructive breakdown. In this type of field effect transistor, the portions comprising the source region, the substrate and the diodes are deemed to form an NPNP device (commonly known as a thyristor) and the NPNP device can actually be operated so that the gate current is fixed at some predetermined holding current value when a surge voltage is applied to the gate electrode which is connected to one of the electrodes of the protective diodes. Once the gate current is fixed, the gate electrode of the MIS transistor becomes inoperative against voltage signals applied to the gate electrode. This operation is not advantageous to the MIS transistor.

BRIEF SUMMARY OF THE INVENTION

The present invention is an improvement over the prior art by providing a further region in the semiconductor member which has the same conductivity type as the substrate but higher impurity concentration and located adjoining the source except for the portion thereof which faces the channel region. With such an arrangement the protective diode will effectively provide a clamping action for signals for either polarity without the gate current being fixed at some level.

DETAILED DESCRIPTION

Figure 1:
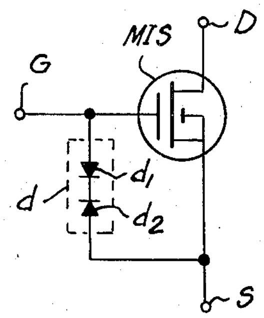
FIG. 1 is an equivalent circuit diagram showing an MIS field effect transistor with two back-to-back diodes between the gate circuit and the source circuit.

Referring to FIG. 1, there is illustrated therein an MIS field effect transistor having a drain terminal D, a source terminal S and a gate terminal G. There is also shown a pair of back-to-back diodes *d*, comprising two diodes *d*1 and *d*2 with their cathodes connected together. The diode unit *d* is connected between the gate terminal G and the source terminal S. This sort of configuration has been provided in the prior art in an effort to protect the gate insulating layer from dielectric breakdown.

Figure 2:
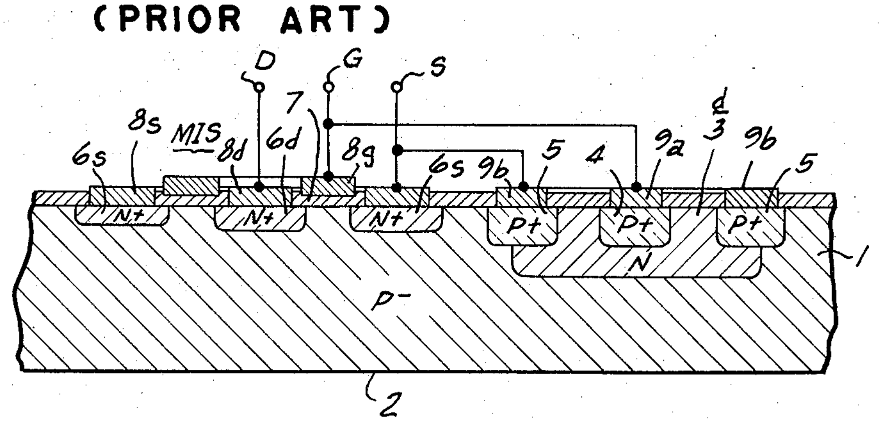
FIG. 2 (PRIOR ART)
FIG. 2 is a fragmentary sectional view of a semiconductor device according to the prior art with the circuit connections schematically illustrated.

The protective diode pair *d* is usually formed in a common semiconductor substrate 1 together with the MIS field effect transistor as shown in FIG. 2. The semiconductor substrate 1 is of relatively low P-type impurity concentration, the concentration being designated as $P^-$. The common cathode regions of the two back-to-back diodes *d*1 and *d*2 are designated as 3 and are of N-type conductivity. In this N-type region 3, an anode region 4 is formed of the same conductivity as that of the substrate 1 but has higher impurity concentration than that of the substrate. Surrounding the P-type region 4 is another anode region 5 similar to the first anode 4 in impurity concentration. This anode region 5 is located at the periphery of the region 3. The diodes *d* thus formed have the same impurity concentrations in their anodes 4 and 5 and thus have the same backward breakdown voltages to clamp the voltage signals.

As shown in FIG. 2, the MIS field effect transistor has a drain region 6*d* of high N-type impurity and a source region 6*s* of high impurity surrounding the drain region 6*d* and spaced therefrom by a suitable distance. The source and drain regions are formed in the substrate 1. A gate insulating layer 7 of a suitable insulating material such as silicon dioxide is also provided on the substrate 1 in the location shown in FIG. 2 of the drawings. A gate electrode 8*g* is provided on the upper surface of the gate insulating layer 7. A drain electrode 8*d* and a source electrode 8*s* are also provided. Anode electrodes 9*a* and 9*b* are provided for the protective diode unit d.

In the device shown in FIG. 2, the P-type region 4 of high impurity concentration, the N-type region 3, the P-type substrate of low impurity concentration and the N-type source region 6*s* of high impurity concentration form a thyristor by virtue of the PNPN structure. When a positive voltage is applied to the electrode 9*a*, the PNPN structure exhibits a negative characteristic voltage. The voltage $\overline{V}_{GS}$ across the gate and the source, and the current $I_{GS}$ therebetween, are plotted in FIG. 3. If the holding current $I_H$ is low at which the thyristor is held in the activated or ON region, the MIS field effect transistor is easily activated into the ON state and is fixed at the holding voltage $\overline{V}_H$. This arrangement has certain circuit disadvantages, for example, the holding current $I_H$ has a value of 0.1 milliamperes when each region has the following impurity concentration:

1: $P^-$-substrate—$3 \times 10^{14} \sim 10^{16}$ Atoms/cm$^3$
3: N-cathode—$10^{18}$ Atoms/cm$^3$ 7 $\mu$ (depth)
4, 5: $P^+$-anode—$5 \times 10^{19}$ Atoms/cm$^3$ 4 $\mu$ (depth)
6*s*, 6*d*: $N^+$-source, drain—$10^{20}$ Atoms/cm$^3$ 2.5 $\mu$ deep The device of the prior art as shown in FIG. 2 may, for example, have a gate insulating layer of $SiO_2$. which is approximately 1,000 A. thick and the channel width may, for example, be 2 $\mu$. The periphery of the channel may be 1,300 $\mu$. The breakover voltage $\overline{V}_{BO}$ of the thyristor (FIG. 3) corresponds to the breakdown voltage of one of the diodes *d*1 and *d*2.

The present invention overcomes some of the principal disadvantages of the prior art. Specifically, it provides a way to increase the holding current $I_H$ in order to prohibit the thyristor structure from being activated into a holding state. In order to increase the holding current, the transport factor to the cathode region 3 of the injected carriers from the source region 6s into the substrate 1 must be decreased. The injected carriers of the prior art device (FIG. 2) have a rather long lifetime and under such circumstances, the transport factor is large and the holding current $I_H$ is small because the substrate has a low impurity concentration of about $3 \times 10^{14} \sim 10^{16}$ atoms/cm$^3$.

Figure 4:
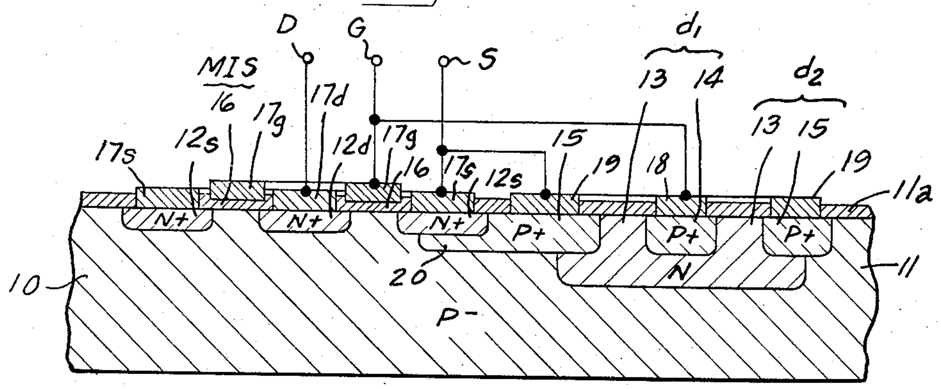
FIG. 4 is a fragmentary sectional view with schematically illustrated circuit connections of an MIS field effect transistor and back-to-back diodes embodying the novel teachings of the present invention.

A preferred form of the present invention is illustrated in FIG. 4 and there is shown there an N-channel type MIS field effect transistor. The silicon substrate generally is designated as 11 while the reference character 10 designates the P-type region 10 of the substrate. A high impurity N-type drain region **12*d* of N-type impurity and a high impurity concentration source drain 12*s* is provided which surrounds the drain region 12*d*. A ring-shaped insulating layer 16 is formed between the drain region 12*d* and the source region 12*s*. A gate electrode 17*g* is formed on the gate insulating layer 16. A source electrode 17*s* and a drain electrode 17*d* are deposited on the source and drain regions 12*s* and 12*d* to provide the desired ohmic contact. It will thus be noted that an MIS field effect transistor has been formed in the substrate 11**.

In addition to the MIS field effect transistor, there are also two protective diodes *d*1 and *d*2 formed in the substrate 11. A common cathode region 13 of N-type conductivity is formed and an anode region 14 of P-type high impurity concentration is formed to make a diode *d*1. At the periphery of region 13, another anode region 15 is formed to make another diode *d*2. Each anode region has anode electrodes 18 and 19 for ohmic contacts. The anode electrodes 18 and 19 are electrically connected to the gate electrode **17*g* and the source electrode 17*s***, respectively, of the MIS field effect transistor.

One of the principal features of the present invention is the provision of a further region 20 adjoining the source region **12*s* of the MIS field effect transistor. This region 20 has the same type impurity concentration but of higher value than that of the region 10. The region 20 lies adjacent to the source electrode 17s** between the diodes *d* and the source **12*s* and also extends around and under a portion of the source 12*s* as shown in FIG. 4. It will be noted that this region 20** does not lie in the region of the channel.

Figure 5:
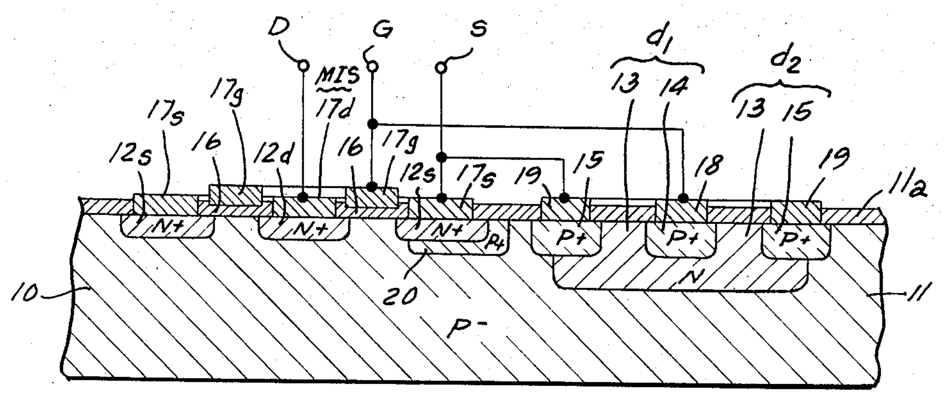
FIG. 5 is a view similar to FIG. 4 illustrating a modified form of the present invention.

This region 20 may be a portion of the extended anode region 15 of the protective diode *d*2 or may be provided separately from the anode region 15 as shown in FIG. 5.

The regions **12*s*, 12*d*, 13, 14, 15 and 20 can be formed by the usual selective diffusion technique. The regions 14, 15 and 20 particularly can be formed during the same diffusion period. It is apparent, therefore, that there will be no additional process steps to form the further region 20**.

Figure 3:
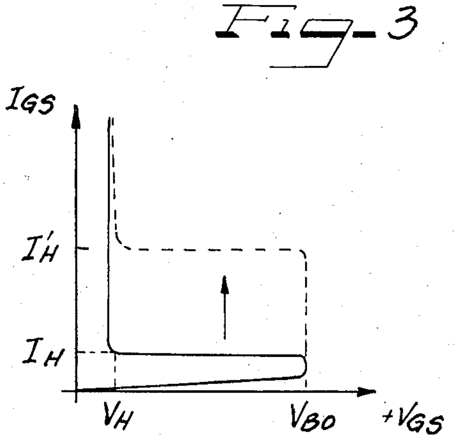
FIG. 3 is the characteristic curve (as shown in full lines) of the device shown in FIG. 2 and is the characteristic curve of the device of FIG. 4 (as shown in dotted lines).

According to the above-described structure of the invention, the PNPN structure of the regions 13, 14, 10 and **12*s* are interrupted by the region 20 of high impurity concentration to decrease the carrier injection and if any carriers are injected, they will recombine to decrease the lifetime of the carriers. For this reason the transport factor from the source region 12*s* to the region 13 is made small. Thus the holding current shifts from $I_H$ to $I_{H'}$ as shown in FIG. 3** together with the characteristic curve indicated by the dotted line. The value of the shifted holding current is about 20 milliamperes or more. Hence, there will be less possibility of activating the PNPN structure by providing gate current more than the holding current $I_{H'}$.

This invention facilitates the MIS transistor device and the protective diodes being aligned more closely to bring out close integration density. Each region has the same density and depth as hereinbefore described.

While the above-described embodiments employ N-type channel MIS field effect transistors, it will be appreciated that the present invention can be applied to P-type channel MIS field effect transistors.

I claim as my invention:

1. An MIS device comprising a body of semiconductor substrate, source and drain regions of first conductivity type in said substrate defining a channel region of second conductivity type therebetween at a surface of said body, an insulating layer over said channel region having a gate electrode thereon, protection means for said insulating layer having a pair of back-to-back pn junction diodes within said substrate and electrically coupled between said gate and source electrodes and a further region of said second conductivity type having a greater impurity concentration than that of said channel region, said further region covering the under portion and surrounding said source region in the area between said source region and said diodes except for the portion of the source region under said insulating layer and the portion facing said channel region.

2. An MIS device according to claim 1 wherein said further region and one of the regions which construct said protection means are common.

3. An MIS device according to claim 1 wherein said pair of diodes has a common region of one conductivity type and two opposite conductivity regions of substantially same impurity concentration.

4. An MIS device comprising a semiconductor substrate of one conductivity type, an FET formed in the upper surface of said substrate including source and drain regions of the opposite conductivity type, source and drain electrodes formed on said source and drain regions, a portion of said substrate lying between said drain and source regions forming a channel region, a layer of insulating material overlying said channel to form a gate, a gate electrode contacting said insulating material over said channel region, a pair of back-to-back diodes formed in said upper surface of said substrate including a first and second region of the same conductivity type as said substrate but of higher concentration and a third region of opposite impurity concentration lying between said first and second regions, and a protective region of high impurity concentration of the same conductivity type to that of said substrate covering the under portion of said source region and the side portion of said source region facing said first region of said back-to-back diodes but remaining away from said channel region, said source electrode being electrically connected to said first region of said diodes and said gate electrode being electrically connected to said second region.

5. A device according to claim 4 in which said protective region is integral with and forms a part of said first region of said diodes.

6. A device according to claim 4 in which said protective region is spaced from said first region of said diodes.

* * * * *